(12) United States Patent
Tu et al.

(10) Patent No.: US 11,611,040 B2
(45) Date of Patent: Mar. 21, 2023

(54) MANUFACTURING METHOD OF DISPLAY PANEL USING AN INK-JET PRINTING AND DISPLAY PANEL INCLUDING THE SAME

(71) Applicant: Shenzhen China Star Optoelectronics Semiconductor Display Technology Co., Ltd., Shenzhen (CN)

(72) Inventors: Aiguo Tu, Shenzhen (CN); Jinchuan Li, Shenzhen (CN); Weiran Cao, Shenzhen (CN); Yuanchun Wu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/758,998

(22) PCT Filed: Jan. 13, 2020

(86) PCT No.: PCT/CN2020/071750
§ 371 (c)(1),
(2) Date: Apr. 24, 2020

(87) PCT Pub. No.: WO2021/128509
PCT Pub. Date: Jul. 1, 2021

(65) Prior Publication Data
US 2022/0320434 A1    Oct. 6, 2022

(30) Foreign Application Priority Data
Dec. 26, 2019   (CN) .......................... 201911361802.4

(51) Int. Cl.
*H01L 29/08*   (2006.01)
*H01L 51/00*   (2006.01)
*H01L 51/56*   (2006.01)

(52) U.S. Cl.
CPC .......... *H01L 51/0005* (2013.01); *H01L 51/56* (2013.01)

(58) Field of Classification Search
CPC .. H01L 51/0005; H01L 51/56; H01L 27/3244
(Continued)

(56) References Cited

U.S. PATENT DOCUMENTS

2002/0079832 A1* 6/2002 Van Tongeren .... H01L 51/5203
313/504
2007/0237889 A1   10/2007 Cheng
(Continued)

FOREIGN PATENT DOCUMENTS

CN    104908423 A    9/2015
CN    106206983 A    12/2016
(Continued)

*Primary Examiner* — Phuc T Dang
(74) *Attorney, Agent, or Firm* — Nathan & Associates; Menachem Nathan

(57) ABSTRACT

A manufacturing method of a display panel and a display panel are provided by the application. The manufacturing method of the display panel includes steps of providing a substrate; forming a thin film transistor layer, an anode layer, and a pixel definition layer on the anode layer on the substrate, wherein the pixel definition layer comprises a plurality of pixel definition regions; printing an ink-jet printing ink on the anode layer inside the pixel definition regions to form an ink-jet printing precursor layer; and printing a membrane surface improving solvent on the ink-jet printing precursor layer, wherein after the membrane surface improving solvent volatilizes, an ink-jet printing layer is formed.

16 Claims, 3 Drawing Sheets

(58) Field of Classification Search
USPC .......................................................... 257/40
See application file for complete search history.

(56) References Cited

U.S. PATENT DOCUMENTS

2018/0375052 A1* 12/2018 Yang ..................... H01L 51/56
2019/0245018 A1*  8/2019 Song ................... H01L 27/3246

FOREIGN PATENT DOCUMENTS

| CN | 106803547 A | 6/2017 |
| CN | 107293572 A | 10/2017 |
| CN | 110176477 A | 8/2019 |

* cited by examiner

MANUFACTURING METHOD OF DISPLAY PANEL USING AN INK-JET PRINTING AND DISPLAY PANEL INCLUDING THE SAME

BACKGROUND OF INVENTION

Field of Invention

The application relates to the display field, and particularly relates to a manufacturing method of a display panel, and a display panel.

Description of Prior Art

In manufacturing of large-sized organic light-emitting diode (OLED) display devices, ink-jet printing is often used to prepare organic light-emitting devices. A nonuniform thickness problem of membrane layers exists in membrane layers prepared by ink-jet printing. A nonuniform thickness of membrane layers causes nonuniform brightness and color inside pixels, thus affecting light emission efficiency and lifetime of devices.

In view of this, this application aims to provide a manufacturing method of a display panel and a display panel to improve uniformity of brightness and color inside display pixels, light emission efficiency, and meanwhile can prolong lifetime of devices.

SUMMARY OF INVENTION

A manufacturing method of a display panel is provided, comprising steps of:
providing a substrate;
forming a thin film transistor layer on the substrate;
forming an anode layer on the thin film transistor layer;
forming a pixel definition layer on the anode layer, wherein the pixel definition layer comprises a plurality of pixel definition regions, and the anode layer is exposed by the pixel definition regions;
printing an ink-jet printing ink on the anode layer inside the pixel definition regions, wherein after the ink-jet printing ink is dried, an ink-jet printing precursor layer is formed;
printing a membrane surface improving solvent on the ink-jet printing precursor layer, wherein after the membrane surface improving solvent volatilizes, an ink-jet printing layer is formed; and
forming a cathode layer on the ink-jet printing layer.

In the manufacturing method of the display panel of one embodiment of this application, the ink-jet printing layer comprises one or more of a light-emitting layers, a hole injection layer, and a hole transport layer.

In the manufacturing method of the display panel of one embodiment of this application, a solubility of the membrane surface improving solvent to the inkjet printing precursor layer is less than or equal to a solubility of an ink-jet printing ink solvent to the inkjet printing precursor layer.

In the manufacturing method of the display panel of one embodiment of this application, a polarity intensity of the membrane surface improving solvent is different from a polarity of an ink-jet printing ink solvent.

In the manufacturing method of the display panel of one embodiment of this application, the membrane surface improving solvent comprises at least one component of the ink-jet printing ink solvent.

In the manufacturing method of the display panel of one embodiment of this application, the membrane surface improving solvent comprises at least one mainpart solvent of the ink-jet printing ink solvent.

In the manufacturing method of the display panel of one embodiment of this application, a manufacturing method of the membrane surface improving solvent comprises a step of adding at least one poor solvent into the ink-jet printing ink solvent, wherein a solubility of the poor solvent to the inkjet printing precursor layer is less than a solubility of the inkjet printing ink solvent to the inkjet printing precursor layer.

In the manufacturing method of the display panel of one embodiment of this application, a manufacturing method of the membrane surface improving solvent comprises a step of changing a ratio of components of the ink-jet printing ink solvent to prepare the membrane surface improving solvent.

In the manufacturing method of the display panel of one embodiment of this application, the membrane surface improving solvent uses a same solvent as the ink-jet printing ink, and an amount of the membrane surface improving solvent is less than an amount of an ink-jet printing ink solvent.

In the manufacturing method of the display panel of one embodiment of this application, before the step of forming the cathode layer on the ink-jet printing layer, the manufacturing method further comprises steps of forming an electron transport layer and an electron injection layer on the ink-jet printing layer.

The display panel manufactured by the manufacturing method of the above manufacturing method of the display panel is provided.

A display panel is provided, comprising:
a substrate;
a thin film transistor layer disposed on the substrate;
an anode layer disposed on the thin film transistor layer;
a pixel definition layer disposed on the anode layer, wherein the pixel definition layer comprises a plurality of pixel definition regions, and the anode layer is exposed by the pixel definition regions;
an ink-jet printing layer and a cathode layer stacked in sequence on the anode layer inside the pixel definition regions, wherein a uniformity degree of a membrane surface is greater than 60%, the uniformity degree is calculated by a following formula:
uniformity degree=an area of a pixel region whose thickness equals to a value of an average thickness of the central region of a pixel covering ¼ of the pixel area±5 nm/the pixel area*100%;

In the display panel of one embodiment of this application, the ink-jet printing layer comprises one or more of a light-emitting layers, a hole injection layer, and a hole transport layer.

In the display panel of one embodiment of this application, an electron transport layer and an electron injection layer are disposed on the ink-jet printing layer.

In the display panel of one embodiment of this application, the uniformity degree of the membrane surface of the ink-jet printing layer is in a range from 60% to 80%.

In the display panel of one embodiment of this application, the uniformity degree of the membrane surface of the ink-jet printing layer is in a range from 70% to 80%.

The manufacturing method of display panel can improve uniformity of brightness and color inside display pixels, light emission efficiency of the devices, and the lifetime of the devices by conducting membrane surface improving treatment to an ink-jet printing layer manufactured by ink-jet printing.

BRIEF DESCRIPTION OF DRAWINGS

In order to more clearly illustrate the technical solution of the present invention, a brief description of the drawings that are necessary for the illustration of the embodiments will be given as follows. Obviously, the drawings described below show only some embodiments of the present invention, and a person having ordinary skill in the art may also obtain other drawings based on the drawings described without making any creative effort.

DETAILED DESCRIPTION OF PREFERRED EMBODIMENTS

The present disclosure is further described in detail below with reference to the accompanying drawings and embodiments. Obviously, the following described embodiments are only part of the present disclosure but not all. A person having ordinary skill in the art may obtain other embodiments based on the embodiments provided in the present disclosure without making any creative effort, which all belong to the scope of the present disclosure.

Figure 1:
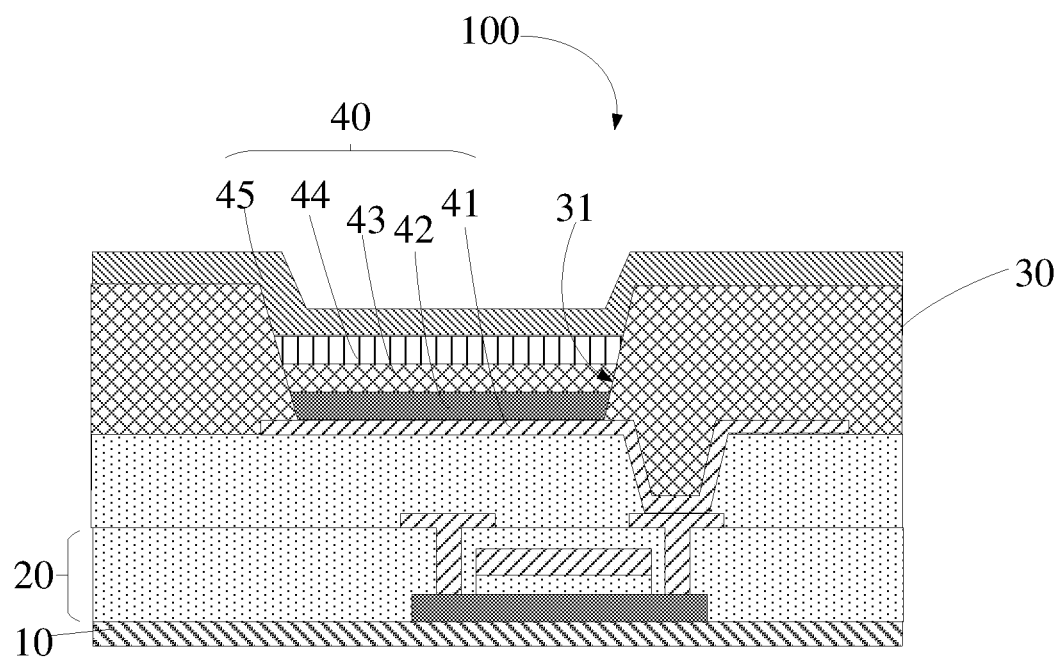
FIG. 1 is a sectional view of a display panel according to one embodiment of this application.

Please refer to FIG. 1 and FIG. 2. A display panel 100 of one embodiment of this application is an organic light-emitting diode display panel. The display panel 100 comprises a substrate 10, a thin film transistor layer 20 disposed on the substrate 10, and a pixel definition layer 30 and a plurality of organic light emitting devices 40 disposed on the thin film transistor layer 20.

The substrate 10 is a transparent substrate. Hard materials such as glass and quartz or flexible materials such as plastic film and paper fiber and so on can be applied to manufacture the substrate 10. A buffer layer can also be configured between the substrate 10 and the thin film transistor layer 20.

The thin film transistor layer 20 comprises a plurality of thin film transistors. Each of the thin film transistors comprises an active layer, a gate insulating layer, a gate electrode layer, an insulating interlayer, and a source/drain electrode stacked in sequence. The display panel 100 further comprises a plurality of gate lines and a plurality of source/drain lines (not shown in drawings) used for driving the thin film transistor layer 20. A planarization layer is also disposed between the thin film transistor layer 20 with the pixel definition layer 30 and the organic light emitting devices 40. It should be noted that the above content is only used to explain the embodiment of the application. A thin film transistor structure in the embodiment and a positional relationship among the membrane layers included therein are not limited to the embodiment. Therefore, no limits are made in the embodiment.

The pixel definition layer 30 comprises a plurality of pixel definition regions 31. The pixel definition regions 31 are used for configuring organic light emitting devices 40. The pixel definition regions 31 can be defined by openings provided in the pixel definition layer 30.

The organic light emitting devices 40 of this application can be top-emitting light-emitting devices or bottom-emitting light-emitting devices. Hereinafter, top-emitting light-emitting devices are taken as an example for illustration. Organic light-emitting device 40 comprises an anode layer 41, a hole injection layer 42, a hole transport layer 43, a light-emitting layer 44, and a cathode layer 45. The anode layer 41, the hole injection layer 42, the hole transport layer 43, and the light-emitting layer 44 are disposed in the pixel definition regions 31. The cathode layer 45 is disposed on the light-emitting layer 44 and covers the pixel definition regions 31 and the pixel definition layer 30.

The anode layer 41 is disposed upon the thin film transistor layer 20 and electrically connected to the drain electrode of the thin film transistor layer 20. A pixel definition layer 30 is disposed on the anode layer 41. The anode layer 41 is exposed by the pixel definition regions 31. The anode layer 41 is a transparent electrode. The anode layer 41 can be a metal layer or a metal oxide layer. Its specific component comprises metal such as aluminum, gold, silver or metal oxide such as indium tin oxide and tin oxide.

The hole injection layer 42 can be a film composed of a conjugated or nonconjugated high conductivity system with carbon or silicon as the main chain; for example, it can be polyaniline, polythiophene, polypyrrole, or poly-phenylene vinylene thin film.

The hole transport layer 43 can be aromatic triamines or carbazole compounds with low ionization energy and organic metal complex thin films, such as polyvinylcarbazole thin films.

The light-emitting layer 44 is mainly formed by organic electroluminescent materials. A material of the light-emitting layer 44 comprises high molecular or low molecular weight organic photoluminescent materials or electroluminescent materials, and fluorescent and phosphorescent compounds.

The cathode layer 45 is a metal cathode, and its material can be metal such as lithium, boron, sodium, calcium, magnesium, beryllium, barium, potassium, aluminum, gold, silver; metal oxide; or alloy of two or more of the above metals.

It can be understood that the organic light-emitting diode display panel of the present application can only include a cathode, a light-emitting layer, and an anode layer; and it can also include one or more layers of an electronic injection layer, an electronic transport layer, an electronic barrier layer, a hole injection layer, a hole transport layer, a hole barrier layer and a charge generation layer.

The hole injection layer 42, the hole transport layer 43, and the light-emitting layer 44 of the organic light-emitting device 40 can be formed by ink-jet printing. Therefore, in the application, each of the three layers can be referred to as ink-jet printing layer. In this embodiment, to improve non-uniformity of a membrane surface induced by ink-jet printing, the ink-jet printing layer is treated with membrane surface improving treatment. The step of forming the ink-jet printing layer treated with membrane surface improving treatment comprises steps of printing an ink-jet printing ink on the anode layer 41 inside the pixel definition regions 31, wherein after the ink-jet printing ink is dried, an ink-jet printing precursor layer is formed; and printing a membrane surface improving solvent on the ink-jet printing precursor layer, drying and baking the membrane surface improving solvent, wherein after the membrane surface improving solvent volatilizes, an ink-jet printing layer is formed. Drying could be vacuum drying, baking, for example, a high-temperature baking. In this application, all of the hole injection layer 42, the hole transport layer 43, and the light-emitting layer 44 can be treated with membrane surface improving treatment, or one or two of the hole injection layer 42, the hole transport layer 43, and the light-emitting layer 44 can be treated with membrane surface improving treatment.

The membrane surface improving solvent can dissolve the ink-jet printing precursor layer, especially bulges on the ink-jet printing precursor layer. After drying and baking, the membrane surface improving solvent is removed and a new formed surface of the ink-jet printing layer becomes flat. For example, the membrane surface improving treatment can improve uniformity of the ink-jet printing precursor layer from 50%-60% to more than 60%, for example, to a range from 60% to 80% or 70% to 80%. Herein, the uniformity degree indicating the homogeneity of the membrane layers can be calculated by a following formula:

uniformity degree=an area of a pixel region whose thickness equals to a value of an average thickness of the central region of a pixel covering ¼ of the pixel area±5 nm/the pixel area*100%.

The above uniformity degree is represented by an area ratio, that is a ratio of an area satisfying a certain preset condition in the pixel region to the total area of the pixel. The certain preset condition is: a thickness is in a range of an average thickness of the central region of a pixel covering ¼ of the pixel area±5 nm. The central region of a pixel covering ¼ of the pixel area refers to an area whose center is the center of the pixel region and its area is ¼ of the total area of the pixel. That is to say, based on the average thickness of the central region of a pixel covering ¼ of the pixel area, the pixel regions whose statistical error is within ±5 nm are selected, and the percentage of all those positions of the pixel region in the pixel area is defined as the uniformity degree.

In one embodiment, a shape of the pixel region is rectangular or oval, and the central region of the pixel covering ¼ of the pixel area is a rectangle whose center is the center of the rectangle or ellipse, and whose length is 60 μm meanwhile width is 30 μm. A long side of the rectangle is parallel to a long side or a long axis of the pixel region, and a short side of the rectangle is parallel to the width or the short axis of the pixel region.

In one embodiment, the membrane surface improving solvent can totally dissolve the ink-jet printing precursor layer or partially dissolve the ink-jet printing precursor layer.

In one embodiment, to partially dissolve the ink-jet printing precursor layer, the membrane surface improving solvent uses the same solvent with the ink-jet printing ink, that is to say, components and a ratio between the components of the membrane surface improving solvent and the ink-jet printing ink solvent are same. However, an amount of the membrane surface improving solvent is less than an amount of the ink-jet printing ink solvent.

In one embodiment, the membrane surface improving solvent applied in the membrane surface improving treatment has a solubility of the inkjet printing precursor layer that is less than or equal to a solubility of the inkjet printing ink solvent of the inkjet printing precursor layer. In one embodiment, a polarity intensity of the membrane surface improving solvent is different from a polarity intensity of the ink-jet printing ink solvent. For example, when the ink-jet printing precursor layer is a polar material, a polarity of the membrane surface improving solvent is adjusted to be less than a polarity of an ink-jet printing ink solvent. When the ink-jet printing precursor layer is a non-polar material, the polarity of the membrane surface improving solvent is adjusted to be greater than a polarity of the ink-jet printing ink solvent. In one embodiment, the membrane surface improving solvent comprises at least one component of the ink-jet printing ink solvent. In one embodiment, the ink-jet printing ink solvent comprises at least one mainpart solvent and at least one additive solvent. For example, the mainpart solvents are solvents accounting for 10% to 100% of the volume fraction of the ink-jet printing ink solvent, and the additive solvents are solvents other than the mainpart solvents. The membrane surface improving solvent comprises at least one mainpart solvent same as the ink-jet printing ink solvent. For example, in one embodiment, the ink-jet printing ink comprises benzene with a volume fraction of 50% and methylbenzene with a volume fraction of 20%, and the membrane surface improving solvent also comprises one or two of benzene and methylbenzene. In one embodiment, c is prepared by adding at least one poor solvents of the ink-jet printing precursor layer into the solvents of the ink-jet printing ink. A solubility of the poor solvent for the inkjet printing precursor layer is less than a solubility of the inkjet printing ink for the inkjet printing precursor layer. For example, when the ink-jet printing precursor layer is a polar material, the membrane surface improving solvent is prepared by adding at least one non-polar solvent into the ink-jet printing ink solvent. In one embodiment, components of the membrane surface improving solvent are same as components of the ink-jet printing ink solvent, but their ratios of the components are different. A manufacturing method of the membrane surface improving solvent comprises a step of changing a ratio of the components of the ink-jet printing ink solvent to prepare the membrane surface improving solvent. In one embodiment, a temperature of the membrane surface improving solvent is different from a temperature of the ink-jet printing ink solvent.

The ink-jet printing ink solvent and the membrane surface improving solvent are selected from one or more of aromatic hydrocarbons, alkanes, alcohols-ethers, esters, and alcohols. Alkanes can be listed as one or more alkanes with 9 to 16 carbon atoms. Aromatic hydrocarbon can be listed as one or more of benzene, methylbenzene, methoxybenzene, 1,2,3-trimethylbenzene, 1,2,4-trimethylbenzene, 1,3,5-trimethylbenzene, naphthalene, tetrahydronaphthalene, decahydronaphthalene, 1-methylnaphthalene, etc. Aromatic hydrocarbon can also be listed as halogenated aromatic hydrocarbon, such as one or more of bromobenzene, iodobenzene, 1,2-dichlorobenzene, 1,3-dichlorobenzene, 1,2-dibromobenzene, 1,3-dibromobenzene, o-chlorotoluene, p-chlorotoluene, o-bromotoluene, and p-bromotoluene. Alcohols, for example can be methanol, ethanol, n-propanol, isopropanol, n-butanol, 2-butanol, tert butanol, or 2-methyl-1-propanol.

Figure 2A:
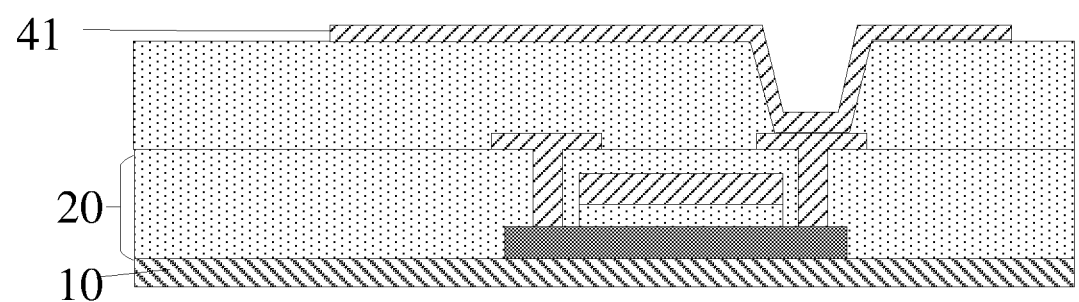
FIG. 2(a) to FIG. 2(e) are schematic diagrams of steps of a manufacturing method of a display panel according to one embodiment of this application.

Please refer to FIG. 2(a) to FIG. 2(d). A manufacturing method of an organic light-emitting diode display panel provided by another embodiment of this application, comprises steps of:

Step S1 (please refer to FIG. 2(a)) of providing a substrate 10, and forming a thin film transistor layer 20 on the substrate 10, wherein the thin film transistor layer 20 comprises an active layer, a gate insulating layer, a gate electrode, an insulating interlayer, and a source/drain electrode stacked in sequence; forming an anode layer 41 on the thin film transistor layer 20, wherein the anode layer 41 can be formed by depositing and patterning metal film; and forming an pixel definition layer 30 on the thin film transistor layer 20. A plurality of pixel definition regions 31 are formed in the pixel definition layer 30. The pixel definition layer 30 can be formed by coating an organic material on the substrate and then conducting drying treatment to the organic material. The pixel definition regions 31 can be formed by providing a plurality of openings in the pixel definition layer 30 by a photolithography method. The pixel definition regions 31 are used to contain the organic light-emitting devices 40, and the anode layer 41 is exposed by the pixel definition regions 31.

Figure 2B:
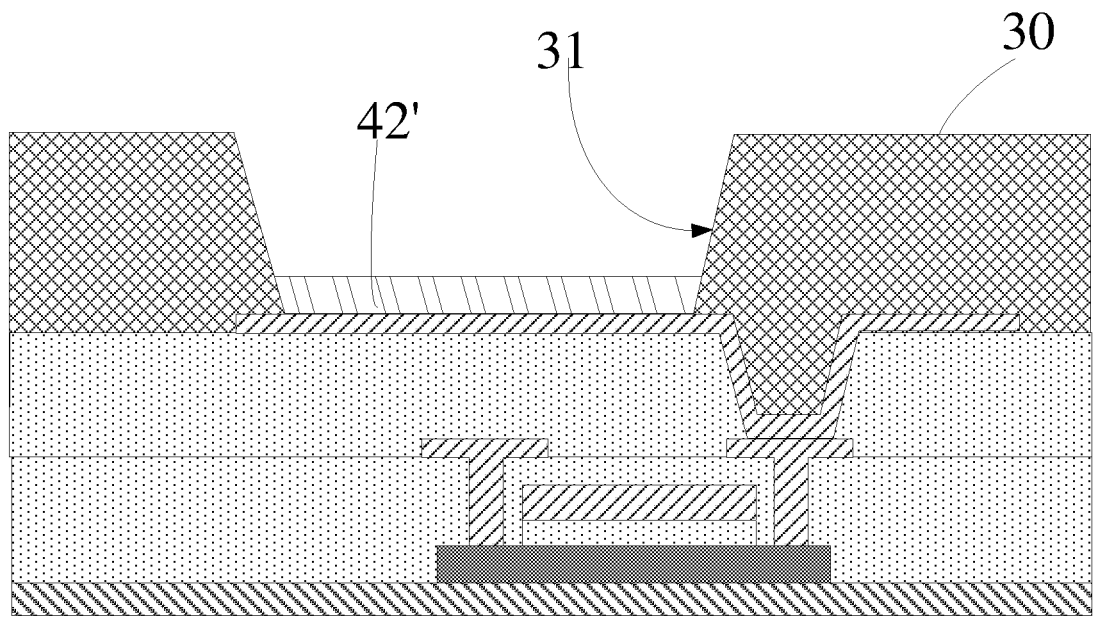
Figure 2C:
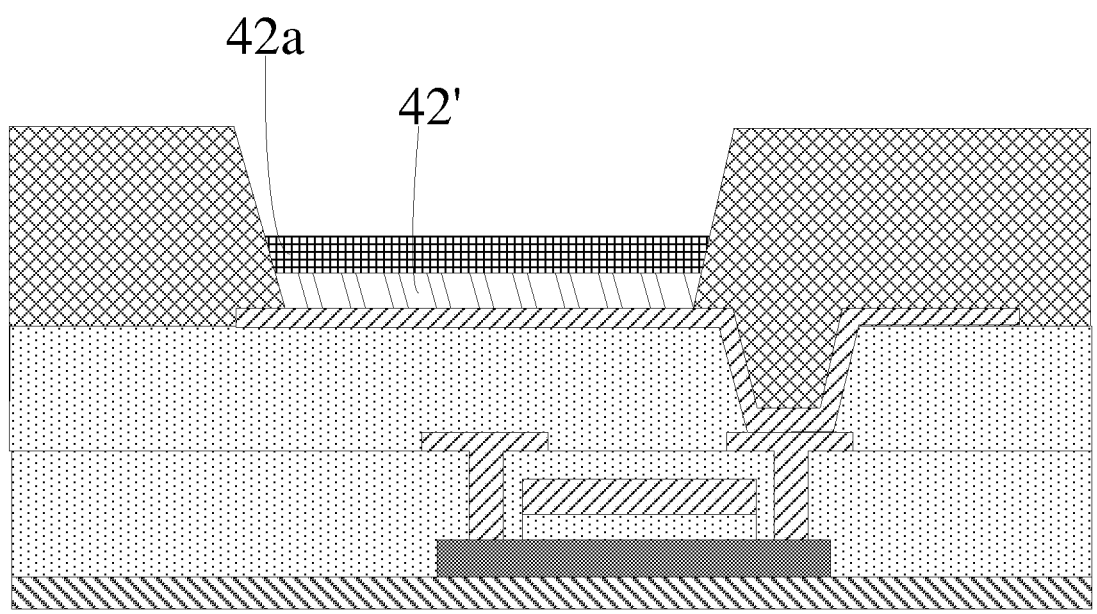
Figure 2D:
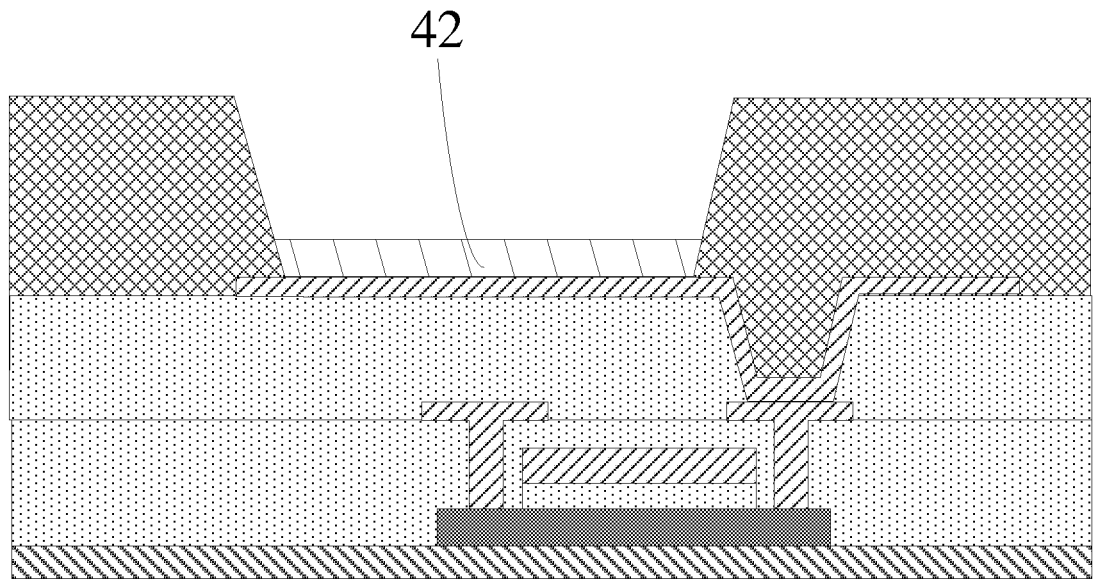

Step S3 (please refer to FIG. 2(b) to FIG. 2(d)) of printing an ink-jet printing ink on the anode layer 41 inside the pixel definition regions 31, wherein after the ink-jet printing ink is dried, an ink-jet printing precursor layer 42' is formed;

And conducting a membrane surface improving treatment to a precursor layer of the hole injection layer 42', wherein the membrane surface improving treatment comprises a step of printing a membrane surface improving solvent 42a on the precursor layer of the hole injection layer 42', drying, and baking the membrane surface improving solvent 42a. After the membrane surface improving solvent volatilizes, the precursor layer of the hole injection layer 42' becomes an hole injection layer 42.

The membrane surface improving solvent can dissolve the ink-jet printing precursor layer, especially bulges on the ink-jet printing precursor layer. After drying and baking, the membrane surface improving solvent is removed and a new formed surface of the ink-jet printing layer becomes flat. For example, the membrane surface improving treatment can improve uniformity of the ink-jet printing precursor layer from 50%-60% to more than 60%, for example, to a range from 60% to 80% or 70% to 80%. Herein, the uniformity degree indicating the homogeneity of the membrane layers can be calculated by a following formula:

uniformity degree=an area of a pixel region whose thickness equals to a value of an average thickness of the central region of a pixel covering ¼ of the pixel area±5 nm/the pixel area*100%.

The above uniformity degree is represented by an area ratio, that is a ratio of an area satisfying a certain preset condition in the pixel region to the total area of the pixel. The certain preset condition is: a thickness is in a range of an average thickness of the central region of a pixel covering ¼ of the pixel area±5 nm. The central region of a pixel covering ¼ of the pixel area refers to an area whose center is the center of the pixel region and its area is ¼ of the total area of the pixel. That is to say, based on the average thickness of the central region of a pixel covering ¼ of the pixel area, the pixel regions whose statistical error is within ±5 nm are selected, and the percentage of all those positions of the pixel region in the pixel area is defined as the uniformity degree.

In one embodiment, a shape of the pixel region is rectangular or oval, and the central region of the pixel covering ¼ of the pixel area is a rectangle whose center is the center of the rectangle or ellipse, and whose length is 60 μm meanwhile width is 30 μm. A long side of the rectangle is parallel to a long side or a long axis of the pixel region, and a short side of the rectangle is parallel to the width or the short axis of the pixel region.

In one embodiment, the membrane surface improving solvent can totally dissolve the ink-jet printing precursor layer or partially dissolve the ink-jet printing precursor layer.

In one embodiment, to partially dissolve the ink-jet printing precursor layer, an amount of the membrane surface improving solvent is less than an amount of the ink-jet printing ink solvent.

In one embodiment, the membrane surface improving solvent applied in the membrane surface improving treatment has a solubility of the inkjet printing precursor layer that is less than or equal to a solubility of the inkjet printing ink solvent of the inkjet printing precursor layer. In one embodiment, a polarity intensity of the membrane surface improving solvent is different from a polarity intensity of the ink-jet printing ink solvent. For example, when the ink-jet printing precursor layer is a polar material, a polarity of the membrane surface improving solvent is adjusted to be less than a polarity of an ink-jet printing ink solvent. When the ink-jet printing precursor layer is a non-polar material, the polarity of the membrane surface improving solvent is adjusted to be greater than a polarity of the ink-jet printing ink solvent. In one embodiment, the membrane surface improving solvent comprises at least one component of the ink-jet printing ink solvent. In one embodiment, the ink-jet printing ink solvent comprises at least one mainpart solvent and at least one additive solvent. For example, the mainpart solvents are solvents accounting for 10% to 100% of the volume fraction of the ink-jet printing ink solvent, and the additive solvents are solvents other than the mainpart solvents. The membrane surface improving solvent comprises at least one mainpart solvent same as the ink-jet printing ink solvent. For example, in one embodiment, the ink-jet printing ink comprises benzene with a volume fraction of 50% and methylbenzene with a volume fraction of 20%, and the membrane surface improving solvent also comprises one or two of benzene and methylbenzene. In one embodiment, the membrane surface improving solvent is prepared by adding at least one poor solvents of the ink-jet printing precursor layer into the solvents of the ink-jet printing ink. A solubility of the poor solvent for the inkjet printing precursor layer is less than a solubility of the inkjet printing ink for the inkjet printing precursor layer. For example, when the ink-jet printing precursor layer is a polar material, the membrane surface improving solvent is prepared by adding at least one non-polar solvent into the ink-jet printing ink solvent. In one embodiment, components of the membrane surface improving solvent are same as components of the ink-jet printing ink solvent, but their ratios of the components are different. A manufacturing method of the membrane surface improving solvent comprises a step of changing a ratio of the components of the ink-jet printing ink solvent to prepare the membrane surface improving solvent. In one embodiment, a temperature of the membrane surface improving solvent is different from a temperature of the ink-jet printing ink solvent.

Materials of the ink and the membrane surface improving solvent are already illustrated in the above embodiments, and herein descriptions are omitted.

Figure 2E:
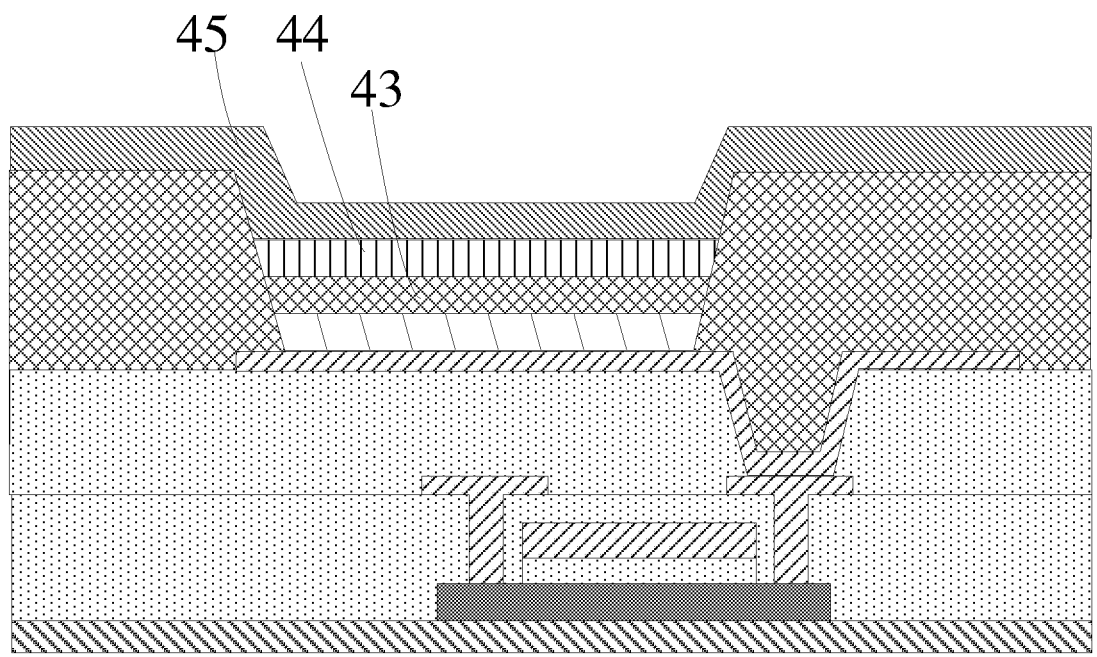

Please refer to FIG. 2(e), a cathode layer 45 is formed on the ink-jet printing layer 42 conducted with the membrane surface improving treatment. The cathode layer 45 can be formed by depositing transparent or half-transparent conductive material. The cathode layer 45 is disposed upon the pixel definition regions 31 and covers the pixel definition regions 31 and the pixel definition layer 30.

Please refer to FIG. 2(e), it can be understood that the manufacturing method of this application comprises printing a hole transport layer 43 and a light-emitting layer 44 on the hole injection layer 42 conducted with the membrane surface improving treatment using ink-jet printing. In this application, one or more of the hole injection layer 42, the hole transport layer 43 and the light-emitting layer 44 can be conducted with membrane surface improving treatment to improve the nonuniformity of membrane surface induced by an ink-jet printing. A cathode layer 45 is formed on the ink-jet printing layer conducted with membrane surface improving treatment to complete the manufacturing of the organic light-emitting devices 40.

It can be understood that the manufacturing method of this application can further comprises steps of forming structures such as an electron injection layer, an electron transport layer, an electron barrier layer, a hole barrier layer and a charge generation layer and so on.

The manufacturing method of display panel can improve uniform of brightness and color inside display pixels, light emission efficiency of the devices and the lifetime of the devices by conducting membrane surface improving treatment to an ink-jet printing layer manufactured by ink-jet printing.

The above description provides a detailed introduction to the application. In this disclosure, specific examples are applied to explain principle and embodiments of the application. The description of the above embodiments is only used to help understand the application. At the same time, for those skilled in the art, according to the thought of the present disclosure, there will be changes in the specific embodiments and application scope. In conclusion, the content of the specification should not be understood as the limitation of the application.

What is claimed is:

1. A manufacturing method of a display panel, comprising steps of:
    providing a substrate;
    forming a thin film transistor layer on the substrate;
    forming an anode layer on the thin film transistor layer;
    forming a pixel definition layer on the anode layer, wherein the pixel definition layer comprises a plurality of pixel definition regions, and the anode layer is exposed by the pixel definition regions;
    printing an ink-jet printing ink on the anode layer inside the pixel definition regions, wherein after the ink-jet printing ink is dried, an ink-jet printing precursor layer is formed;
    printing a membrane surface improving solvent on the ink-jet printing precursor layer, wherein after the membrane surface improving solvent volatilizes, an ink-jet printing layer is formed; and
    forming a cathode layer on the ink-jet printing layer.

2. The manufacturing method of the display panel of claim 1, wherein the ink-jet printing layer comprises one or more of a light-emitting layers, a hole injection layer, and a hole transport layer.

3. The manufacturing method of the display panel of claim 1, wherein a solubility of the membrane surface improving solvent to the inkjet printing precursor layer is less than or equal to a solubility of an ink-jet printing ink solvent to the inkjet printing precursor layer.

4. The manufacturing method of the display panel of claim 1, wherein a polarity intensity of the membrane surface improving solvent is different from a polarity of an ink-jet printing ink solvent.

5. The manufacturing method of the display panel of claim 3, wherein the membrane surface improving solvent comprises at least one component of the ink-jet printing ink solvent.

6. The manufacturing method of the display panel of claim 5, wherein the membrane surface improving solvent comprises at least one mainpart solvent of the ink-jet printing ink.

7. The manufacturing method of the display panel of claim 3, wherein a manufacturing method of the membrane surface improving solvent comprises a step of adding at least one poor solvent into the ink-jet printing ink solvent, wherein a solubility of the poor solvent to the inkjet printing precursor layer is less than a solubility of the inkjet printing ink solvent to the inkjet printing precursor layer.

8. The manufacturing method of the display panel of claim 3, wherein a manufacturing method of the membrane surface improving solvent comprises a step of changing a ratio of components of the ink-jet printing ink solvent to prepare the membrane surface improving solvent.

9. The manufacturing method of the display panel of claim 1, wherein the membrane surface improving solvent uses a same solvent as the ink-jet printing ink, and an amount of the membrane surface improving solvent is less than an amount of an ink-jet printing ink solvent.

10. The manufacturing method of the display panel of claim 1, wherein before the step of forming the cathode layer on the ink-jet printing layer, the manufacturing method further comprises steps of forming an electron transport layer and an electron injection layer on the ink-jet printing layer.

11. The display panel manufactured by the manufacturing method of claim 1.

12. A display panel, comprising:
    a substrate;
    a thin film transistor layer disposed on the substrate;
    an anode layer disposed on the thin film transistor layer;
    a pixel definition layer disposed on the anode layer, wherein the pixel definition layer comprises a plurality of pixel definition regions, and the anode layer is exposed by the pixel definition regions;
    an ink-jet printing layer and a cathode layer stacked in sequence on the anode layer inside the pixel definition regions, wherein a uniformity degree of a membrane surface is greater than 60%, the uniformity degree is calculated by a following formula:

uniformity degree=an area of $a$ pixel region whose thickness equals to $a$ value of an average thickness of the central region of $a$ pixel covering ¼ of the pixel area±5 nm/the pixel area*100%.

13. The display panel of claim 12, wherein the ink-jet printing layer comprises one or more of a light-emitting layers, a hole injection layer, and a hole transport layer.

14. The display panel of claim 12, wherein an electron transport layer and an electron injection layer are disposed on the ink-jet printing layer.

15. The display panel of claim 12, wherein the uniformity degree of the membrane surface of the ink-jet printing layer is in a range from 60% to 80%.

16. The display panel of claim 12, wherein the uniformity degree of the membrane surface of the ink-jet printing layer is in a range from 70% to 80%.

* * * * *